United States Patent
Anand et al.

(10) Patent No.: US 8,686,723 B2
(45) Date of Patent: Apr. 1, 2014

(54) DETERMINING THE LARMOR FREQUENCY FOR NMR TOOLS

(75) Inventors: Vivek Anand, Houston, TX (US);
Robert Freedman, Houston, TX (US);
Anatoly Dementyev, Sugar Land, TX (US); Payam Tabrizi, Missouri City, TX (US); Daniel Catina, Cypress, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 480 days.

(21) Appl. No.: 12/728,961

(22) Filed: Mar. 22, 2010

(65) Prior Publication Data
US 2011/0227570 A1    Sep. 22, 2011

(51) Int. Cl.
*G01V 3/00* (2006.01)
*G01V 3/18* (2006.01)

(52) U.S. Cl.
USPC .............. 324/303; 324/309; 324/318; 702/8

(58) Field of Classification Search
USPC ...................... 324/300–322; 702/8
See application file for complete search history.

(56) References Cited

U.S. PATENT DOCUMENTS

| | | | | |
|---|---|---|---|---|
| 5,053,710 A * | 10/1991 | Schlereth | | 324/309 |
| 5,291,137 A * | 3/1994 | Freedman | | 324/303 |
| 5,451,873 A * | 9/1995 | Freedman et al. | | 324/303 |
| 5,457,873 A | 10/1995 | Cattaneo | | |
| 6,891,371 B1 * | 5/2005 | Frigo et al. | | 324/307 |
| 7,026,814 B2 * | 4/2006 | Bordon et al. | | 324/303 |
| 7,114,562 B2 | 10/2006 | Fisseler et al. | | |
| 7,215,119 B2 | 5/2007 | Kruger et al. | | |
| 2005/0140368 A1 * | 6/2005 | Freedman | | 324/303 |
| 2005/0156592 A1 * | 7/2005 | Bordon et al. | | 324/303 |
| 2006/0158186 A1 * | 7/2006 | Park et al. | | 324/307 |
| 2007/0182408 A1 * | 8/2007 | Blanz et al. | | 324/303 |
| 2009/0116595 A1 | 5/2009 | Senroy et al. | | |

OTHER PUBLICATIONS

Tang et al., "LP-zoom, a linear prediction method for local stectral analysis of NMR signal" Journal of Magnetic Resonace 79, 190-196 (1988).*
International Search Report and Written Opinion for International Application No. PCT/US2011/029311 dated Dec. 28, 2011.

* cited by examiner

*Primary Examiner* — Jermele M Hollington
*Assistant Examiner* — Emily Chan
(74) *Attorney, Agent, or Firm* — John Vereb; Harjit Kohli

(57) ABSTRACT

The Larmor frequency for an in situ nuclear magnetic resonance (NMR) tool is determined and used to acquire NMR data. An NMR tool is provided and placed in situ, for example, in a wellbore. An initial estimate of the Larmor frequency for the in situ NMR tool is made and NMR data are acquired using the in situ NMR tool. A spectral analysis is performed on the NMR data, or optionally, the NMR data are digitized and a discrete Fourier transform (DFT) is performed on the digitized NMR data. The modal frequency of the spectral analysis or DFT is determined, and the Larmor frequency for the in situ NMR tool is determined using the modal frequency. The NMR tool is modified to transmit at the determined Larmor frequency and then used to acquire further NMR data.

30 Claims, 12 Drawing Sheets

DETERMINING THE LARMOR FREQUENCY FOR NMR TOOLS

CROSS-REFERENCE TO RELATED APPLICATIONS

Not applicable.

BACKGROUND OF THE DISCLOSURE

Nuclear Magnetic Resonance (NMR) tools used for well-logging or downhole fluid characterization measure the response of nuclear spins in formation fluids to applied magnetic fields. Downhole NMR tools typically have a permanent magnet that produces a static magnetic field at a desired test location (e.g., where the fluid is located). The static magnetic field produces a non-equilibrium magnetization in the fluid. The magnetization is aligned along the direction of the static field. The magnitude of the induced magnetization is proportional to the magnitude of the static field. The proportionality constant is the static magnetic susceptibility. A transmitter antenna produces a time-dependent radio frequency magnetic field that is perpendicular to the direction of the static field. The NMR resonance condition is satisfied when the radio frequency is equal to the Larmor frequency, which is proportional to the magnitude of the static magnetic field. The radio frequency magnetic field produces a torque on the magnetization vector that causes it to rotate about the axis of the applied radio frequency field. The rotation results in the magnetization vector developing a component perpendicular to the direction of the static magnetic field. This causes the magnetization vector to precess around the static field at the Larmor frequency. At resonance between the Larmor and transmitter frequencies, the magnetization is tipped to the transverse plane (i.e., a plane normal to static magnetic field vector). A series of radio frequency pulses are applied to generate spin echoes that are measured with the antenna.

The resonance condition requires that the transmitter radio frequency equal the Larmor frequency. Deviation between the two frequencies can lead to inaccurate estimation of porosity, in the case of logging tools, and hydrogen index, in the case of fluid sampling tools. In addition, the deviation can lead to systematic errors in the estimation of relaxation time distributions, thereby resulting in inaccurate estimates of, for example, viscosity, permeability, pore size distribution, irreducible water saturation, etc.

The Larmor frequency when operating in downhole conditions differs from that in the laboratory. This difference is caused by the temperature variation of the magnetization, and in some cases, by the accumulation of magnetic debris in the vicinity of the permanent magnet. Magnetic debris is frequently found in the drilling mud due to the drill string scraping metal particles from well casing while tripping in and out of the hole during drilling operations. The effect of magnetic debris on the Larmor frequency depends on the quantity and distribution of the debris. As a result, the Larmor frequency needs to be determined accurately for downhole conditions. Two methods are currently known for in-situ estimation of the Larmor frequency.

One method, the Larmor Frequency Search Task method, was developed by Freedman, et al and is described in U.S. Pat. No. 5,457,873. In this method, an initial estimate of the Larmor frequency is made based on the temperature of the tool. A series of NMR measurements are made at different operating frequencies. A predetermined response curve is fitted to the measurements to determine the frequency at which the maximum echo amplitude is obtained. The implementation of the method is illustrated in FIG. 1. The figure shows a plot of the initial echo amplitude calculated from the mean of the first ten echoes for a range of transmitter frequencies. The maximum amplitude is observed at 2.270 MHz, which corresponds to an independent measurement of the Larmor frequency using a Hall probe. However, the implementation of this process is time consuming. Additionally, the process requires that the formation porosity remain constant during the measurements, which may not be true if measurements are performed while the tool is moving. Moreover, in low porosity formations, it is not possible to accurately determine the Larmor frequency because of low signal-to-noise ratio (SNR).

A second method, the Echo Phase method, was developed by Bordon, et al and is described in U.S. Pat. No. 7,026,814. If the Larmor and transmitter frequencies are different, the phase of the echo signal changes along the echo interval with respect to the reference radio frequency phase. The difference between the instantaneous phases of the echo signal at two time intervals is linearly related to the deviation between the Larmor and transmitter frequencies, provided the deviation is small. However, the implementation of this method requires a detailed calibration of the electronics (e.g., the phase shifts due to temperature need to be recorded). In addition, the phase difference is influenced to a large extent by antenna tuning (deviation of the resonance frequency of the antenna from the transmitter frequency). Therefore, the detuning of the antenna and its effect on the phase difference needs to be calibrated.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
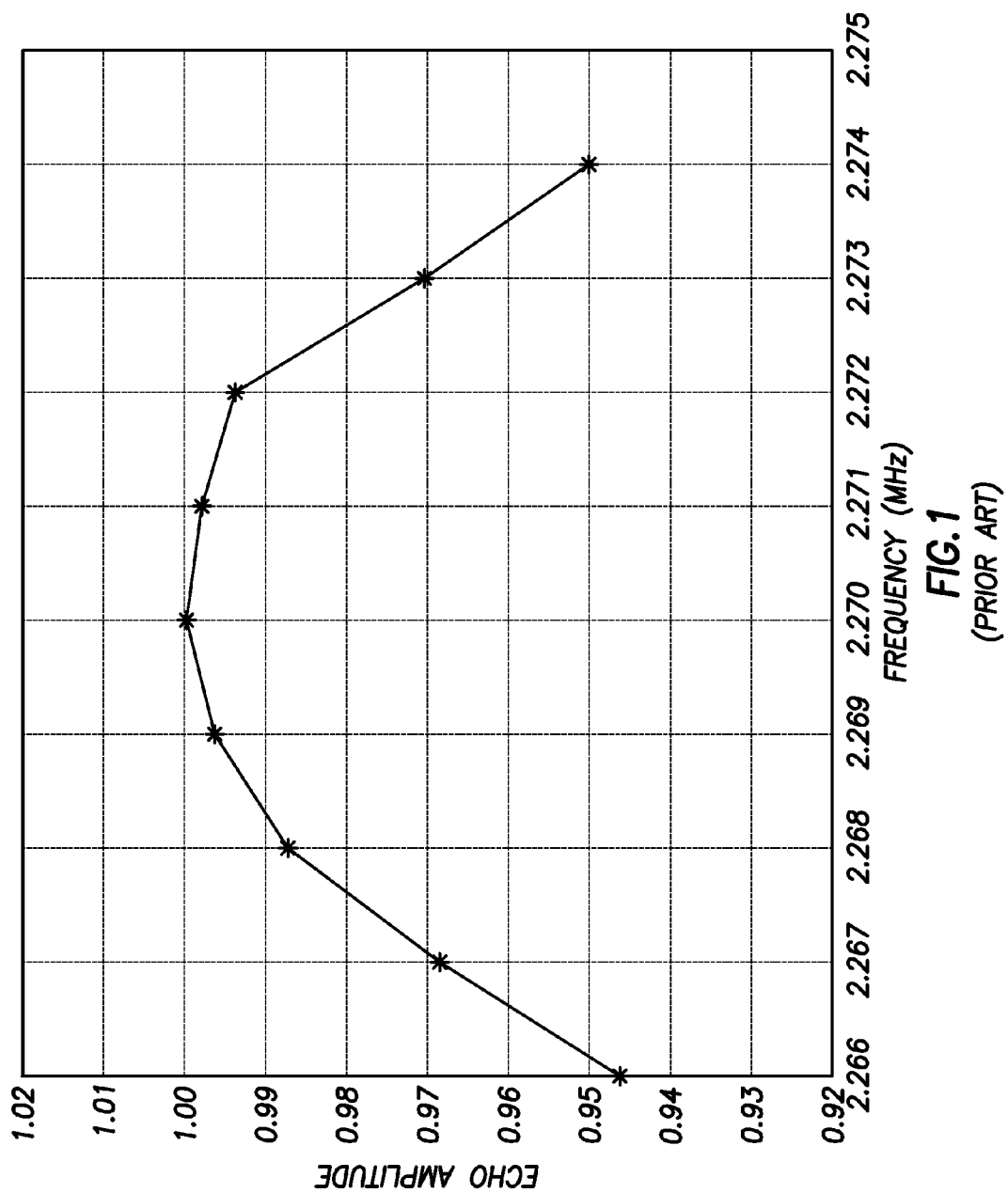
FIG. 1 is a plot of echo amplitude vs. transmitter frequency that may be used by a prior art method to determine the Larmor frequency. The maximum echo amplitude is obtained when the transmitter frequency is equal to the Larmor frequency.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The Larmor frequency of an NMR tool can be determined in situ by performing a (frequency) spectral analysis of the spin-echo or free induction decay signal. For example, the spectral analysis may be done using a Wavelet transform or from the discrete Fourier transform (DFT) of the digitized NMR signal. Other transforms or spectral analysis techniques could also be used.

Figure 2:
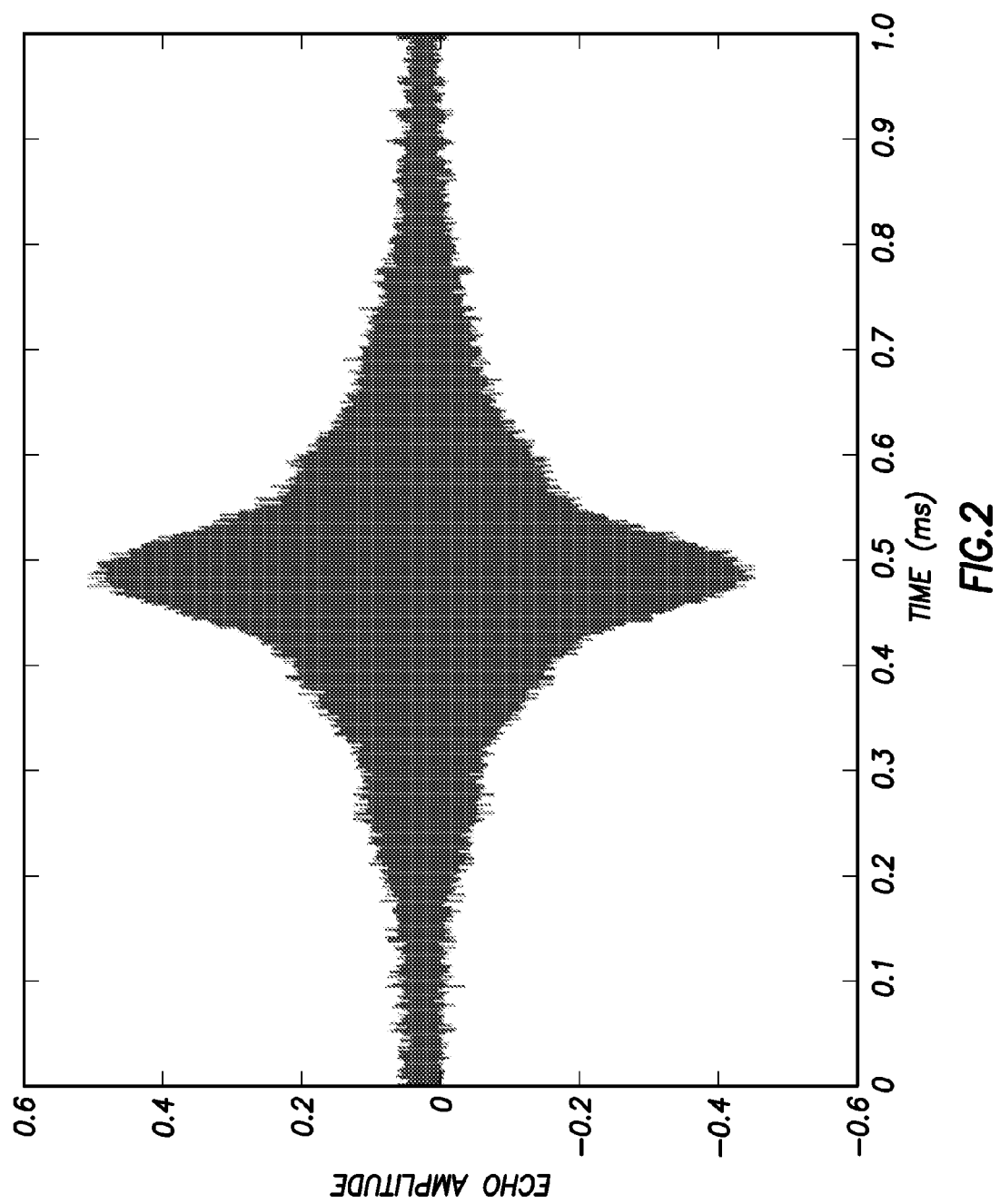
FIG. 2 is a plot of echo amplitude vs. time of an echo signal obtained using a Larmor frequency of 2.270 MHz, according to one or more aspects of the present disclosure. The signal is digitized at a sampling frequency of 50 MHz for a record length of 1 ms.

An analog NMR signal is a superposition of sinusoids in a range of frequencies centered on the Larmor frequency. To digitally extract the echo data from the receiver, at least two paths may be taken. One method involves direct digitization. If fast analog-to-digital (A/D) conversion is available, the echo signal can be directly digitized and recorded. FIG. 2 shows an example of an echo signal obtained using a Larmor frequency of 2.270 MHz digitized at a 50 MHz sampling frequency.

The second path involves the conversion of the echo signal to an intermediate frequency. The echo signal is mixed, or multiplied, with a reference signal of frequency, $f_r$. Mixing the two signals creates two output signals at two different frequencies: one at the sum of the two mixed frequencies, and another at their difference. The higher frequency component can be filtered, and the component at the difference frequency, called the intermediate frequency, is digitized and recorded. This technique may be used if a fast A/D converter is not available.

Regardless of how the digitized signal is obtained, the Larmor frequency can be estimated from the DFT of the digitized signal. To illustrate, let the digitized signal be denoted by x(n), n=1, 2 ... N, where N is the total number of samples in the record. A DFT of the signal resolves the frequencies present in the signal into a discrete set using the following transformation:

$$X(k) = \sum_{n=0}^{N-1} x(n)\exp\left(-\frac{i2\pi kn}{N}\right), \quad k = 0, 1 \ldots N-1. \quad (1)$$

X(k) is a complex number whose magnitude represents the amplitude of a sinusoid with frequency k/N cycles per second.

Figure 3:
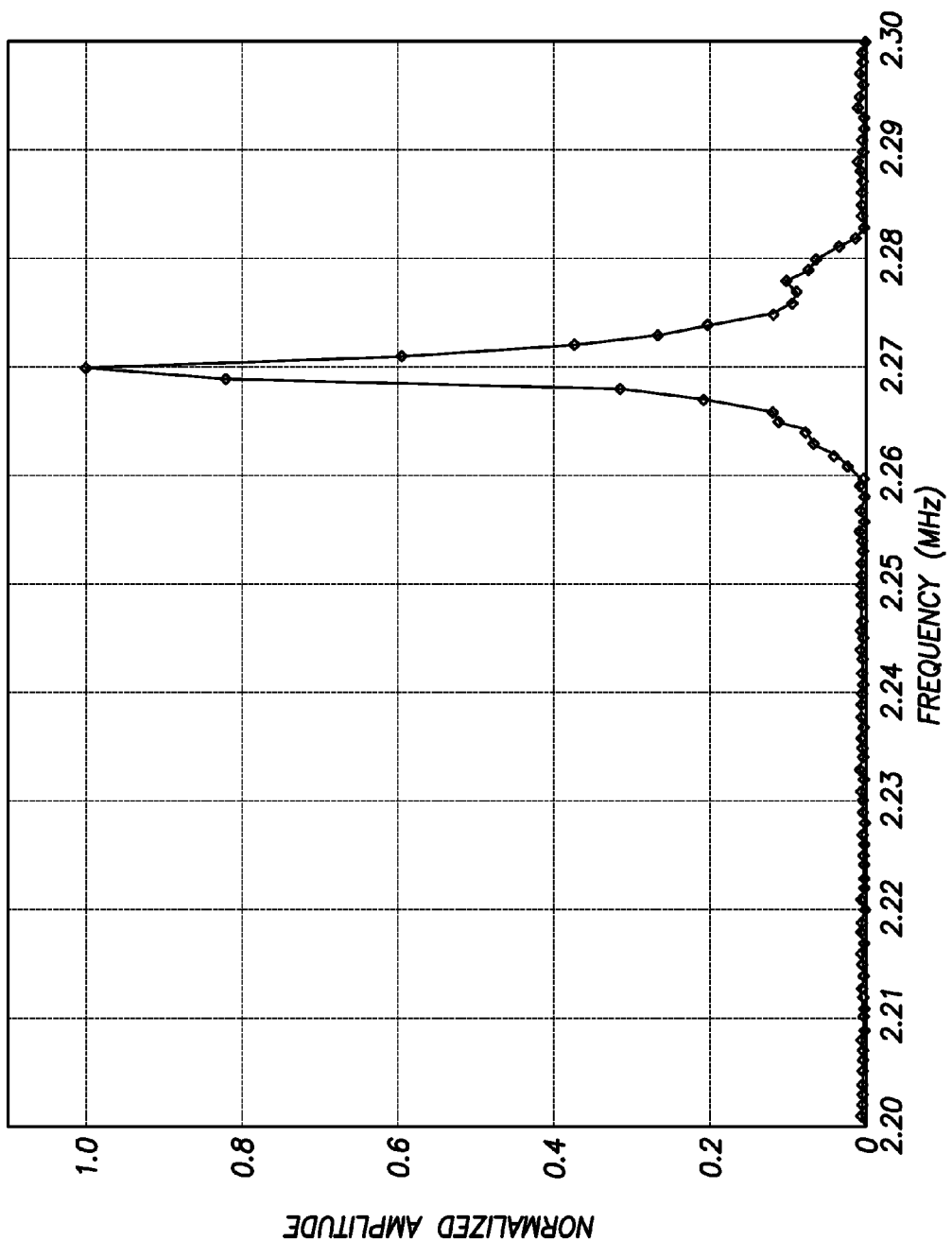
FIG. 3 is a plot of the normalized magnitude of the discrete Fourier transform of the digitized echo signal of FIG. 2, according to one or more aspects of the present disclosure. The x-axis is scaled to the frequency range of 2.2 to 2.3 MHz. The modal frequency corresponds to the Larmor frequency of 2.270 MHz.

As mentioned earlier, an NMR echo signal is a superposition of sinusoids in a range of frequencies centered on the Larmor frequency. This range of frequencies arises primarily due to the inhomogeneity of the static magnetic field. The frequency spectrum of the digitized echo signal can be resolved using the Fourier transformation of Eq. (1). If a direct digitization scheme is used for data acquisition, the Larmor frequency corresponds to the modal frequency, $f_m$, of the DFT magnitude. FIG. 3 shows a plot of the magnitude of the DFT of the digitized echo signal shown in FIG. 2. The mode of the DFT magnitude corresponds to the correct Larmor frequency of 2.270 MHz.

On the other hand, if data are acquired using an intermediate frequency conversion scheme, the Larmor frequency can be determined from the sum of the carrier and the modal frequency as shown below:

$$f_L = f_r + f_m. \quad (2)$$

In the above equation, $f_L$ and $f_r$ are the Larmor and reference carrier frequencies, respectively.

For accurate and precise estimation of the Larmor frequency from the DFT of the echo signal, the NMR signal should be digitized at least twice the expected Larmor frequency to avoiding aliasing effects. This is in accordance with Shannon's sampling theorem which states that the maximum frequency (Nyquist frequency) that can be accurately resolved is equal to half the sampling frequency. In addition, the resolution in frequency space is inversely proportional to the total record length, and is given by:

$$\Delta f = \frac{1}{T} \quad (3)$$

Figure 4:
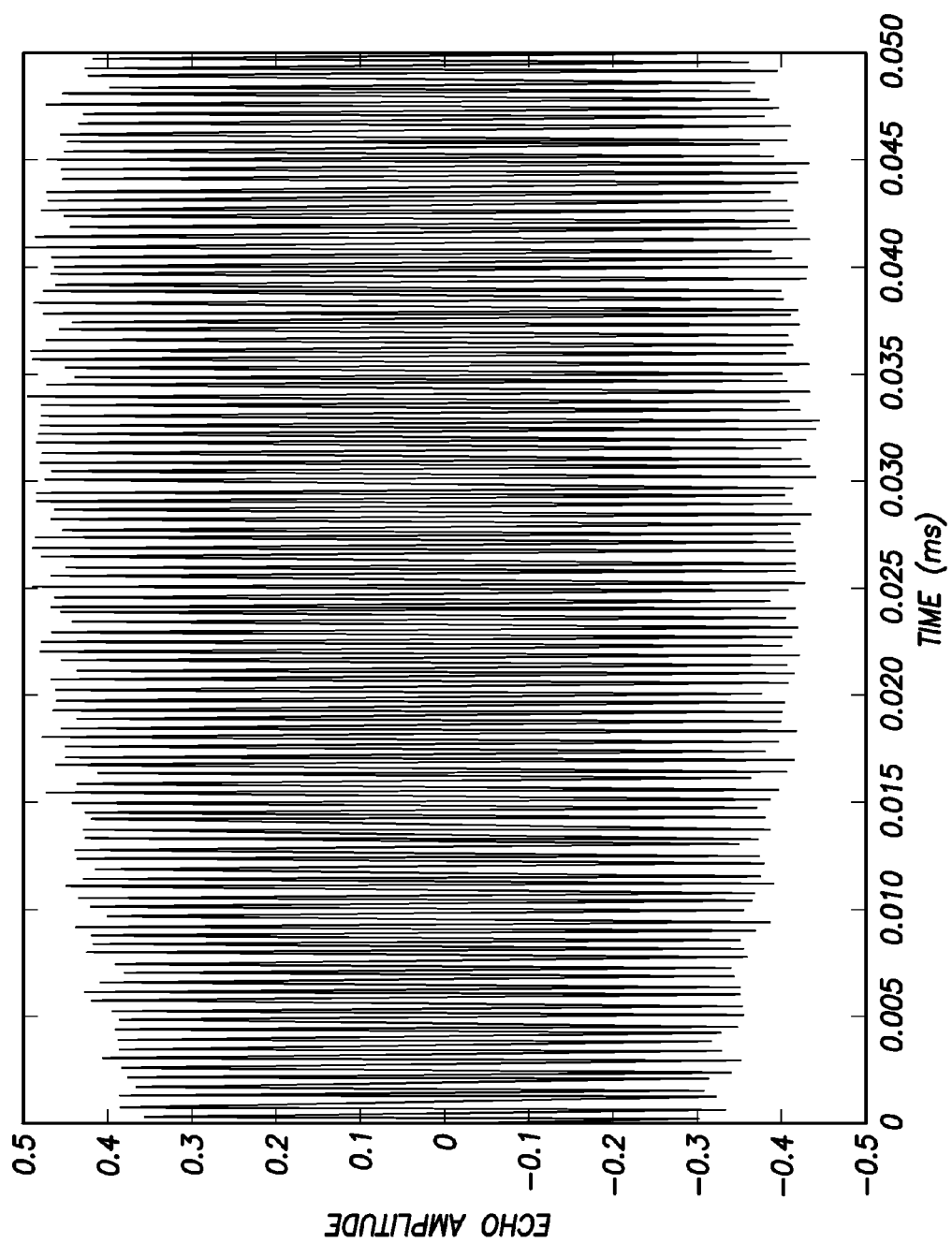
FIG. 4 is a plot of echo amplitude vs. time of an echo signal obtained using a Larmor frequency of 2.270 MHz, according to one or more aspects of the present disclosure. The signal is digitized at the sampling frequency of 10 MHz for a record length of 50 μs.
Figure 5:
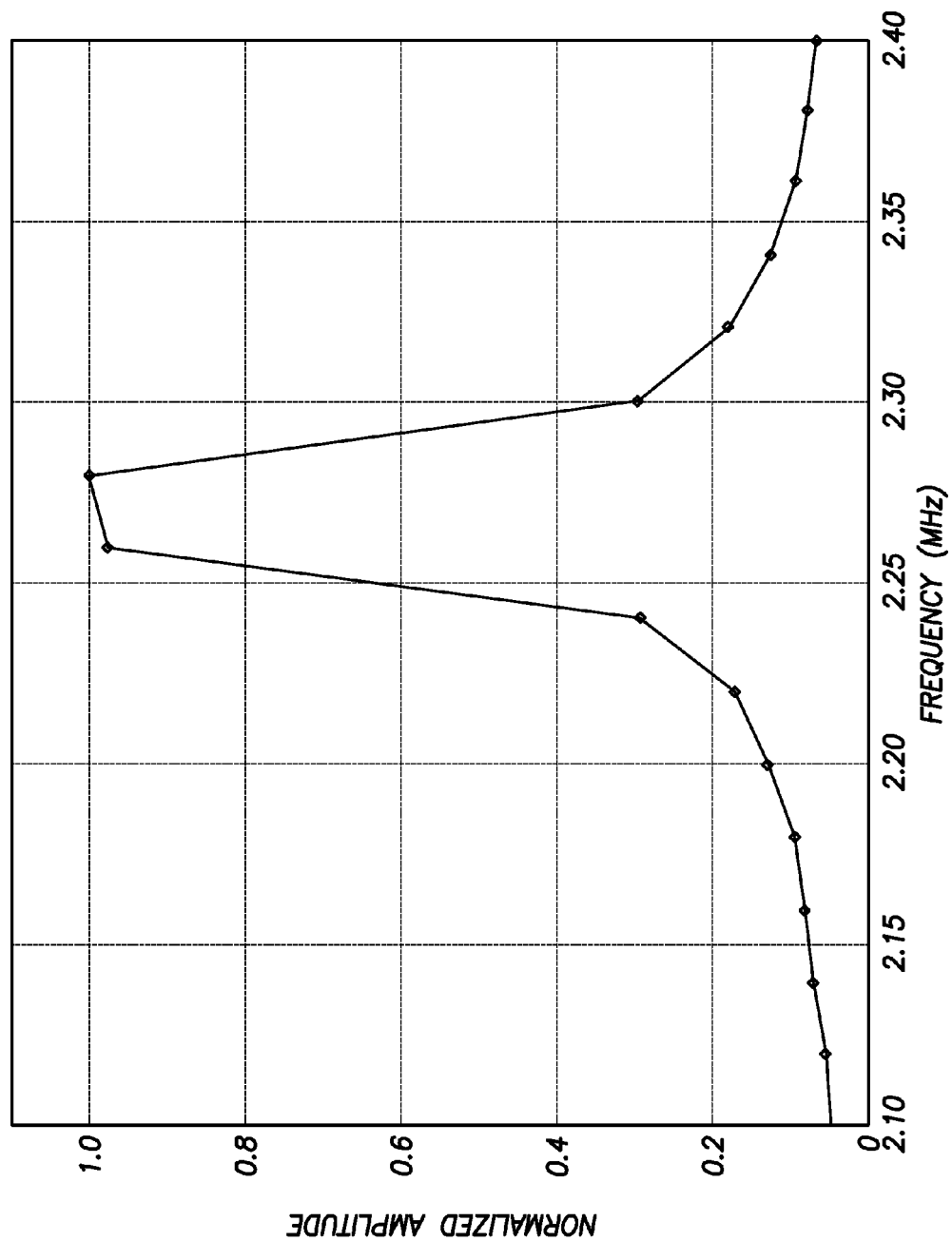
FIG. 5 is a plot of the normalized magnitude of the discrete Fourier transform of the digitized echo signal of FIG. 4, according to one or more aspects of the present disclosure. The x-axis is scaled to the frequency range of 2.1 to 2.4 MHz. An insufficient resolution of 20 KHz is obtained in the frequency space.

The requirement that the signal needs to be digitized at least twice the Larmor frequency implies that the total number of samples, N, in the record length is:

$$N = \frac{f_s}{\Delta f} \geq \frac{2f_L}{\Delta f}, \quad (4)$$

where $f_s$ is the sampling frequency. A resolution on the order of few KHz is typically required for NMR logging tools. Therefore, for a Larmor frequency of 2 MHz and a resolution of 1 KHz, the number of sampling points is at least 4000, and the record length is at least 1 ms. However, due to memory limitations, the echo signal in NMR tools is generally sampled for a much shorter time. For example, FIG. 4 shows the echo signal at a Larmor frequency of 2.270 MHz digitized at a sampling frequency of 10 MHz for a record length of 50 µs. The corresponding normalized DFT is shown in FIG. 5. The resolution of the frequency spectrum is:

$$\Delta f = \frac{1}{50 \cdot 10^{-6}} = 20 \text{ KHz}. \quad (5)$$

Thus, the resolution in the frequency spectrum needs to be improved, without increasing the record length. This is accomplished by appending the digitized echo data with zeros at the end. This process is called zero padding. The required resolution in the frequency space is obtained by adding $N_z$ zeros as shown below:

$$\Delta f = \frac{f_s}{(N + N_z)}. \quad (6)$$

FIG. 5 shows the magnitude of the DFT of the echo signal in FIG. 4. The digitized data can be zero padded such that a frequency resolution of 1 KHz is obtained. The number of added zeros, $N_z$, is calculated from Eq. (6) as follows:

$$N_z = \frac{f_s}{\Delta f} - N \quad (7)$$

For the particular case being considered, $$\Rightarrow N_z = \frac{10 \cdot 10^6}{10^3} - (10 \cdot 10^6)(50 \cdot 10^{-6}) = 9500 \quad (8)$$

Figure 6:
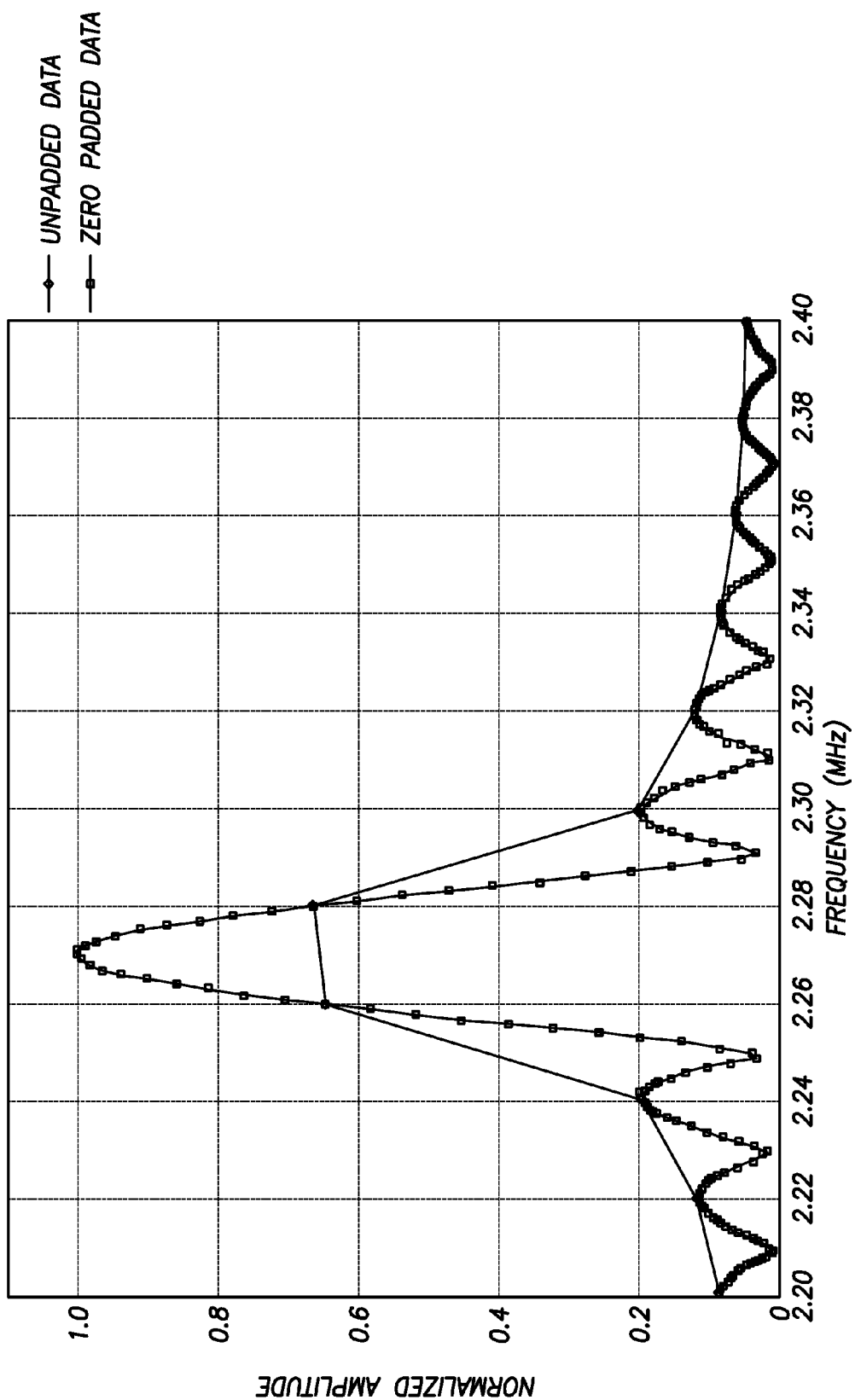
FIG. 6 is a plot of the normalized magnitude of the discrete Fourier transform of the zero padded echo data of FIG. 4, according to one or more aspects of the present disclosure. For reference, the normalized magnitude of the DFT of the unpadded data is also shown.

The mode of the DFT is located at the correct Larmor frequency of 2.270 MHz, as shown in FIG. 6.

It should be noted that, in addition to the magnitude of the DFT, the real or imaginary components of the DFT of the zero padded data can also be used to estimate the Larmor frequency. For an echo signal with a phase angle of zero, the modal frequency of the real component corresponds to the Larmor frequency. Additionally, the imaginary component of the DFT has a zero crossing close to the Larmor frequency. Those two results are, however, valid only when the phase of the echo signal is zero. Therefore, for the real or imaginary components of the DFT to be used to determine the Larmor frequency, the echo signal must first be phase rotated such that the phase of the echo signal is zero.

Because in general the echo phase is non-zero, the data often needs to be phase corrected such that the phase is at least close to zero. This operation can be easily performed in the frequency domain. Let X denote the Fourier transform of a time domain signal x with non-zero phase φ. Let Y denote the Fourier transform of the phase-rotated signal with zero phase. Both X and Y are complex numbers with real and imaginary components. Y can be obtained from X using the following operation:

$$ReY = Re\{X\} \cdot \cos \phi + Im\{X\} \cdot \sin \phi$$

$$ImY = -Re\{X\} \cdot \sin \phi + Im\{X\} \cdot \cos \phi \quad (9)$$

The phase φ of the time domain signal, x, can be approximated as follows. First, x is resolved into two orthogonal components $S_r$ and $S_x$ shown below:

$$S_r = \sum_{n=1}^{N_p} x(n) \cdot \cos\left(\frac{2\pi f_T (n-1)}{f_s}\right) \quad (10)$$

$$S_x = \sum_{n=1}^{N_p} x(n) \cdot \sin\left(\frac{2\pi f_T (n-1)}{f_s}\right)$$

In the above equation, $f_T$ is the transmitter frequency used for the NMR experiment, $f_s$ is the sampling frequency, and $N_p$ is the number of sampling points per period, given as:

$$N_p = \frac{f_s}{f_T} \quad (11)$$

Second, the phase of the echo is determined from the calculated values of $S_r$ and $S_X$ as follows:

$$\phi = \tan^{-1}\left\{\frac{S_x}{S_r}\right\} \quad (12)$$

Figure 7:
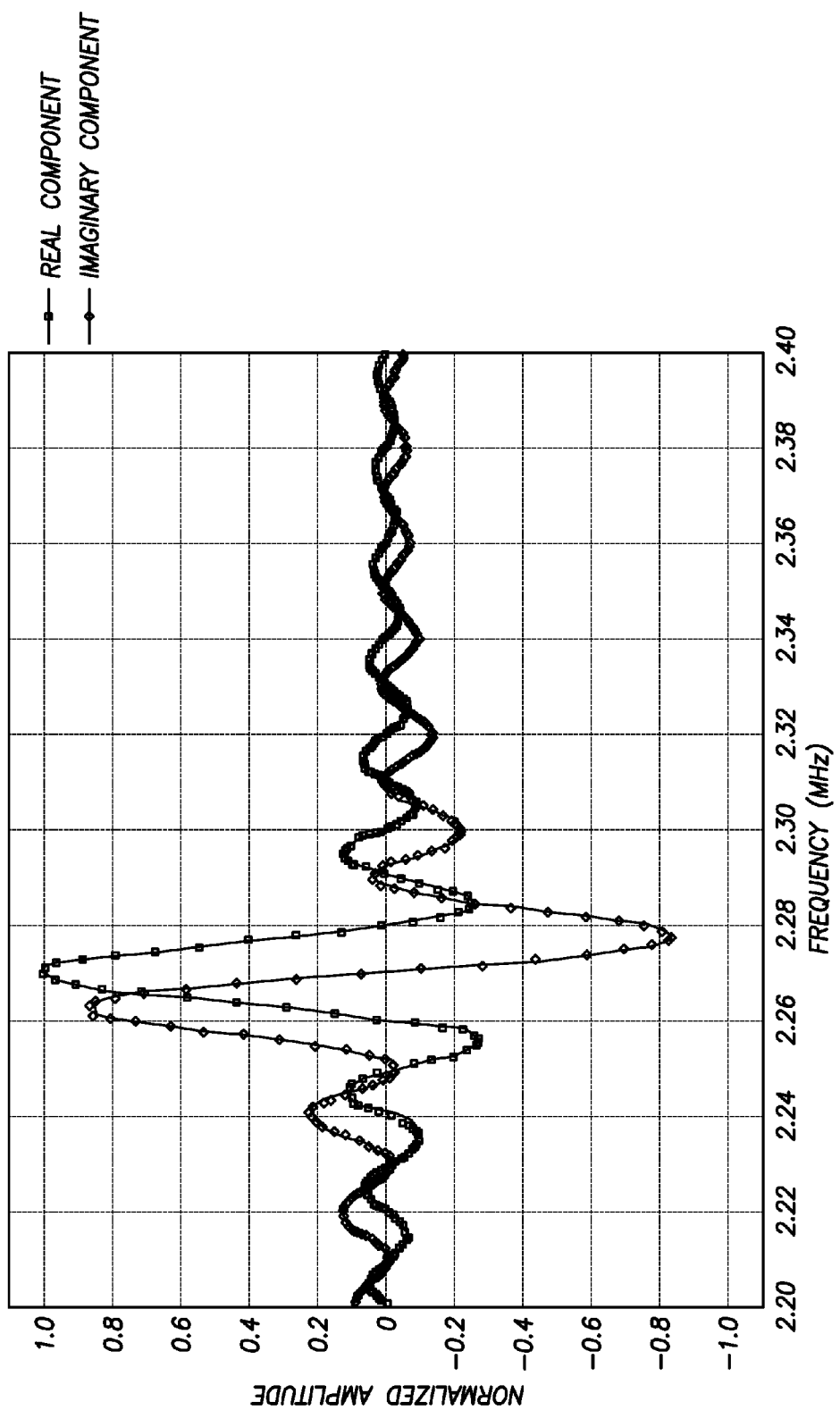
FIG. 7 is a plot of the real and imaginary components of the Fourier transform of the zero padded echo data shown in FIG. 4, according to one or more aspects of the present disclosure.

FIG. 7 shows the phase-rotated real and imaginary components of the Fourier transform of the data shown in FIG. 4. The data are zero padded to obtain a frequency resolution of 1 KHz. The phase of the echo is calculated from Eqs. (9)-(12). The real component has a maximum at the correct Larmor Frequency of 2.270 MHz, while the imaginary component has a zero crossing close to the correct Larmor frequency.

The Larmor frequency can also be determined from a DFT of the free induction decay (FID) signal of transverse magnetization after the initial 90° pulse. Similar to CPMG (Carr, Purcell, Meiboom, and Gill) echoes, FID data can also be zero padded and phase rotated for accurate estimation.

Figure 8:
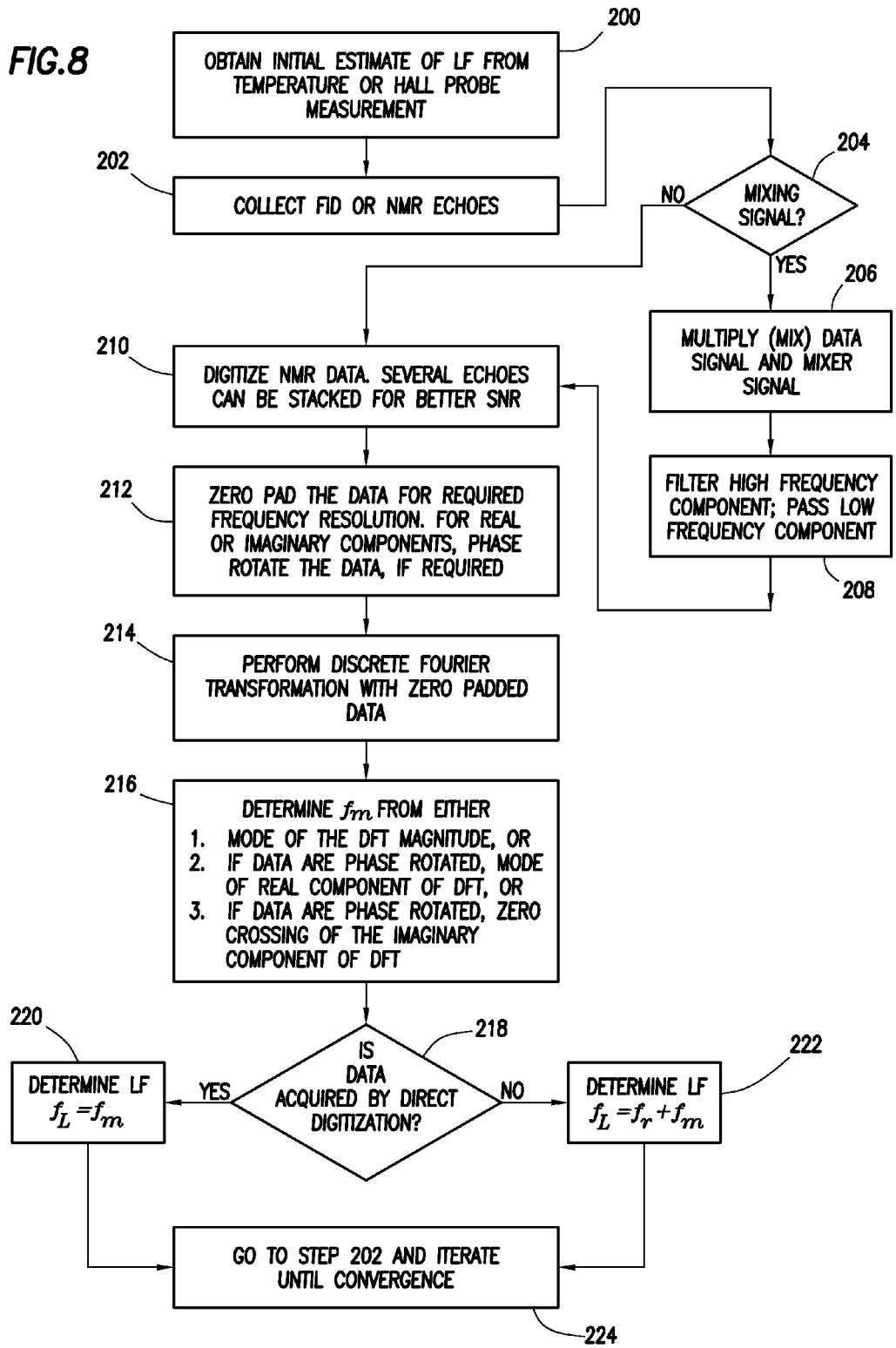
FIG. 8 is a flow-chart diagram of at least a portion of a method, according to one or more aspects of the present disclosure.

FIG. 8 is a flowchart that shows, for a particular embodiment, the steps for estimating the Larmor frequency for an NMR tool. In step 200, an initial estimate of the Larmor frequency is made using, for example, a temperature or Hall probe measurement. FID and/or spin-echo data are obtained using the NMR tool (step 202). If a fast A/D converter is available, the data can be directly digitized (step 210). If not, one may choose to mix the signal. That decision is made in step 204. If mixing, then the data signal and mixing signal are mixed (multiplied) (step 206), and the output is filtered to remove the high frequency component and pass the low frequency component (step 208). The low frequency component is then digitized (step 210). Several echoes can be stacked (i.e., added together), if desired, to improve the signal-to-noise ratio.

If the desired frequency resolution requires it, the digitized data can be zero padded (step 212). Also, if either the real or imaginary components of the DFT are to be used, as opposed to, say, the magnitude of the DFT, those real or imaginary components should be phase rotated to zero out the phase. A DFT is then performed on the (zero padded) data (step 214). The modal frequency, or frequency with the maximum amplitude, can be determined from the mode (i.e., peak) of the DFT magnitude, from the mode of the real component of the DFT, or the zero crossing of the imaginary component of the DFT (step 216). Determining the Larmor frequency now depends on whether the data were digitized directly or mixed and then digitized (step 218). If directly digitized, the Larmor frequency is given by $f_L = f_m$ (step 220). If the signal was mixed and then digitized, the Larmor frequency is given by $f_L = f_r + f_m$ (step 222). If the solution for the Larmor frequency has converged, e.g., the norm of the difference between the current estimate and the previous estimate is within a given tolerance, then the process is halted an the Larmor frequency is determined. Otherwise, the process returns to the data acquisition step (step 202) and is iteratively repeated until convergence is achieved (step 224).

Determining the Larmor frequency can be performed regardless of whether the data were obtained, for example, using a wireline, sampling, or while-drilling NMR tool. Also, though the examples shown and described use a discrete Fourier transform, other transform methods could be used, or special cases of a DFT, such as a Fast Fourier Transform, could be used.

Figure 9:
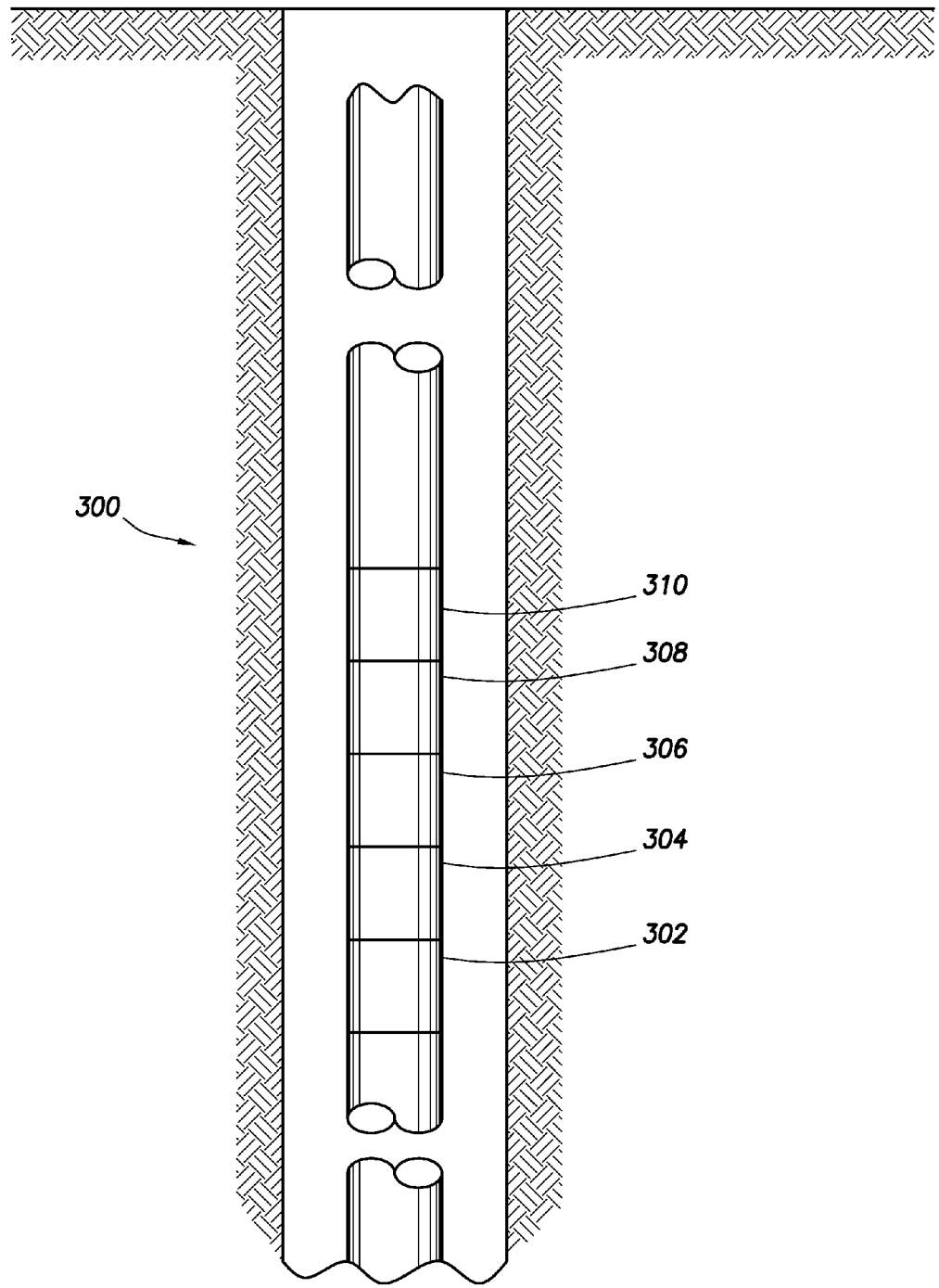
FIG. 9 is a schematic drawing showing an NMR system disposed in a wellbore, according to one or more aspects of the present disclosure.

An NMR system 300 (FIG. 9) that operates using a Larmor frequency determined while the NMR system 300 is disposed in situ includes a source 302 for a static magnetic field, an antenna 304 for transmitting and receiving an electromagnetic signal; electronics 306 to modify the resonance frequency of the antenna 304; a sensor 308 to measure an in situ temperature or an in situ magnitude of the static magnetic field; and a processor 310 capable of: (1) providing an initial estimate of the Larmor frequency using information from the sensor 308, (2) performing a spectral analysis on NMR data acquired by the antenna 304, and (3) controlling the electronics 306.

Figure 10:
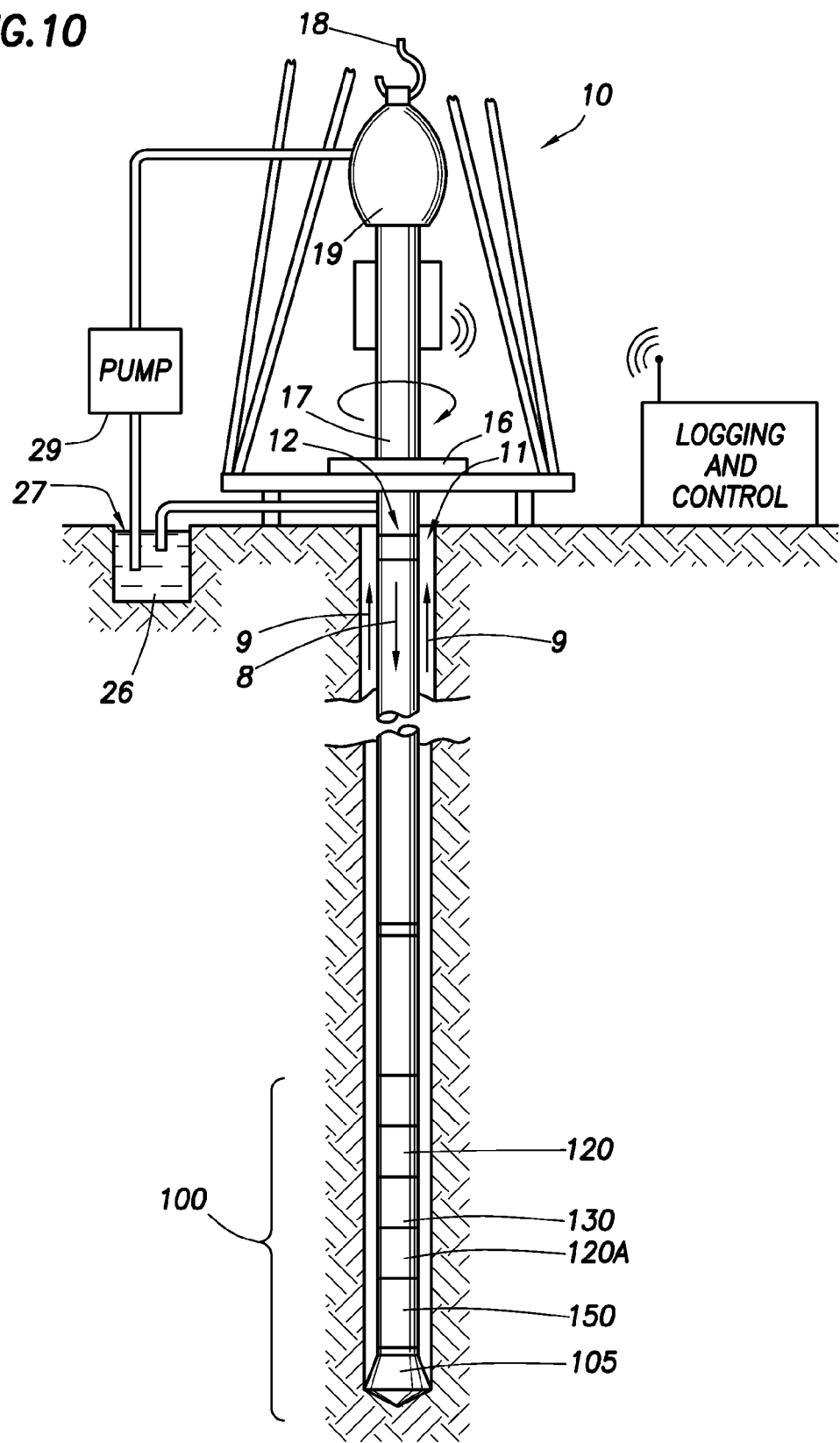
FIG. 10 illustrates a wellsite system in which a while-drilling embodiment of the present invention may be used, according to one or more aspects of the present disclosure.

FIG. 10 illustrates a wellsite system in which one or more aspects of the present disclosure may be employed. The wellsite may be onshore or offshore. In FIG. 10, a borehole 11 is formed in subsurface formations by rotary drilling in a manner that is well known. Embodiments of the present disclosure may also use directional drilling, as will be described hereinafter.

A drill string 12 is suspended within the borehole 11 and has a bottom hole assembly 100 which includes a drill bit 105 at its lower end. The surface system includes platform and derrick assembly 10 positioned over the borehole 11, the assembly 10 including a rotary table 16, kelly 17, hook 18 and rotary swivel 19. The drill string 12 is rotated by the rotary table 16, energized by means not shown, which engages the kelly 17 at the upper end of the drill string. The drill string 12 is suspended from a hook 18, attached to a traveling block (also not shown), through the kelly 17 and a rotary swivel 19 which permits rotation of the drill string relative to the hook. As is well known, a top drive system could alternatively be used.

In the example of this embodiment, the surface system further includes drilling fluid or mud 26 stored in a pit 27 formed at the wellsite. A pump 29 delivers the drilling fluid 26 to the interior of the drill string 12 via a port in the swivel 19, causing the drilling fluid to flow downwardly through the drill string 12, as indicated by the directional arrow 8. The drilling fluid exits the drill string 12 via ports in the drill bit 105, and then circulates upwardly through the annular region between the outside of the drill string 12 and the wall of the borehole 11, as indicated by the directional arrows 9. In this well-known manner, the drilling fluid lubricates the drill bit 105 and carries formation cuttings up to the surface as it is returned to the pit 27 for recirculation.

The bottom hole assembly 100 of the illustrated embodiment includes, but is not limited to, a logging-while-drilling (LWD) module 120, a measuring-while-drilling (MWD) module 130, a roto-steerable system and motor 150, and drill bit 105.

The LWD module 120 is housed in a special type of drill collar, as is known in the art, and can contain one or a plurality of known types of logging tools. It will also be understood that more than one LWD and/or MWD module can be employed, e.g. as represented at 120A. (References, throughout, to a module at the position of 120 can alternatively mean a module at the position of 120A as well.) The LWD module includes capabilities for measuring, processing, and storing information, as well as for communicating with the surface equipment. In the present embodiment, the LWD module includes a fluid sampling device as well as an NMR device configured according to one or more aspects of the present disclosure or otherwise configured to perform at least a portion of a method within the scope of the present disclosure.

The MWD module 130 is also housed in a special type of drill collar, as is known in the art, and can contain one or more devices for measuring characteristics of the drill string and drill bit. The MWD tool further includes an apparatus (not shown) for generating electrical power to the downhole system. This may typically include a mud turbine generator powered by the flow of the drilling fluid, it being understood that other power and/or battery systems may be employed. In the present embodiment, the MWD module includes one or more of the following types of measuring devices: a weight-on-bit measuring device, a torque measuring device, a vibration measuring device, a shock measuring device, a stick slip measuring device, a direction measuring device, and an inclination measuring device.

Figure 11:
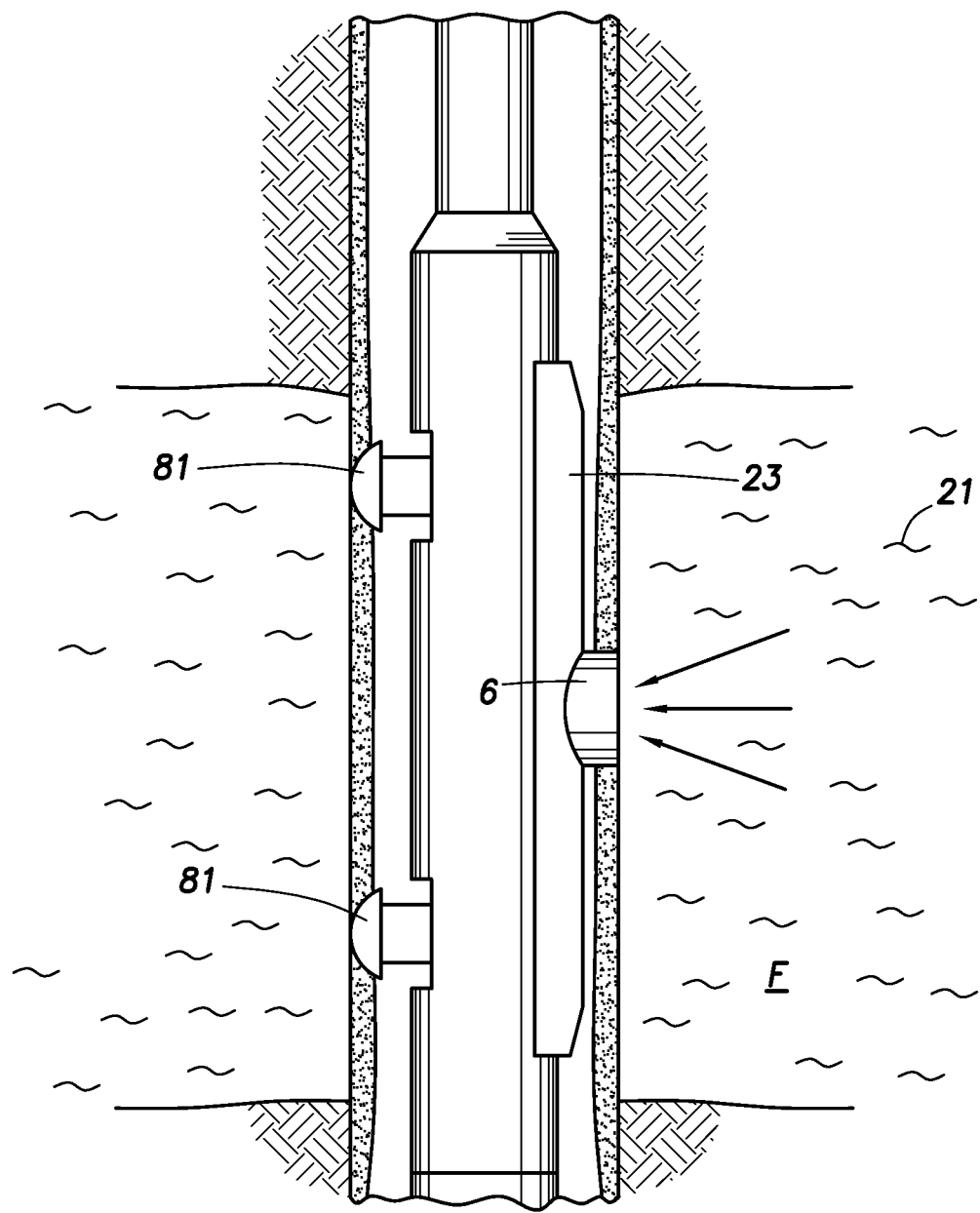
FIG. 11 is a schematic drawing showing an example while-drilling sampling tool disposed in a wellbore, according to one or more aspects of the present disclosure.

FIG. 11 is a simplified diagram of a sampling-while-drilling logging device of a type described in U.S. Pat. No. 7,114,562, incorporated herein by reference, utilized as the LWD tool 120 or part of an LWD tool suite 120A. The LWD tool 120 is provided with a probe 6 for establishing fluid communication with the formation and drawing the fluid 21 into the tool, as indicated by the arrows. The probe may be positioned in a stabilizer blade 23 of the LWD tool and extended therefrom to engage the borehole wall. The stabilizer blade 23 comprises one or more blades that are in contact with the borehole wall. Fluid drawn into the downhole tool using the probe 26 may be measured to determine, for example, pretest and/or pressure parameters. Additionally, the LWD tool 120 may be provided with devices, such as sample chambers, for collecting fluid samples for retrieval at the surface. Backup pistons 81 may also be provided to assist in applying force to push the drilling tool and/or probe against the borehole wall.

Figure 12:
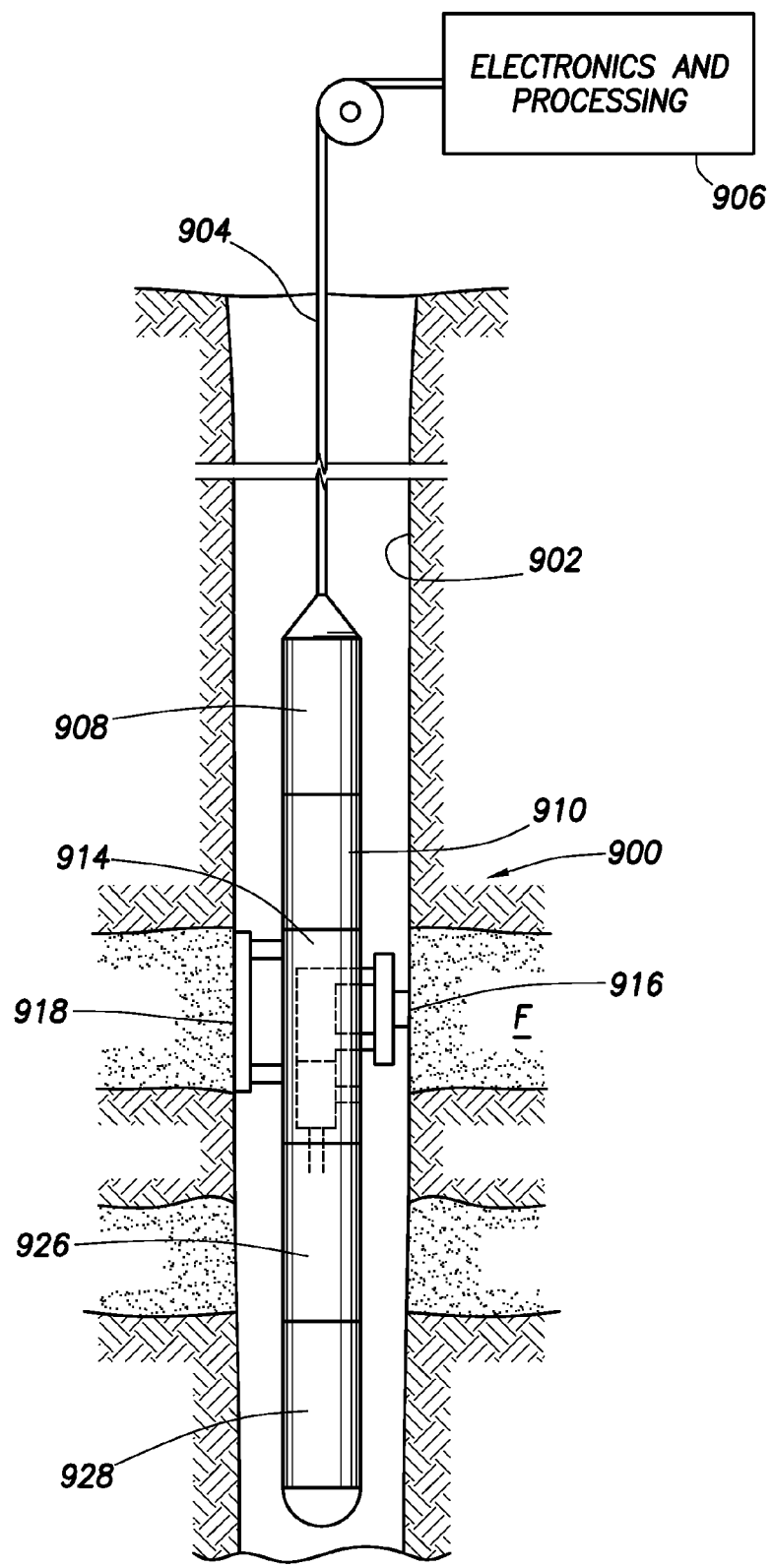
FIG. 12 is a schematic drawing showing an example wireline tool disposed in a wellbore, according to one or more aspects of the present disclosure.

Referring to FIG. 12, shown is an example wireline tool 900 in which aspects of the present disclosure may be implemented. The example wireline tool 900 is suspended in a wellbore 902 from the lower end of a multiconductor cable 904 that is spooled on a winch (not shown) at the Earth's surface. At the surface, the cable 904 is communicatively coupled to an electronics and processing system 906. The example wireline tool 900 includes an elongated body 908 that includes a formation tester 914 having a selectively extendable probe assembly 916 and a selectively extendable tool anchoring member 918 that are arranged on opposite sides of the elongated body 908. NMR system 910 is also included in tool 900. Additional components (not shown) may also be included.

One or more aspects of the probe assembly 916 may be substantially similar to those described above in reference to the embodiments shown in FIGS. 10-11. For example, the extendable probe assembly 916 is configured to selectively seal off or isolate selected portions of the wall of the wellbore 902 to fluidly couple to the adjacent formation F and/or to draw fluid samples from the formation F. Accordingly, the extendable probe assembly 916 may be provided with a probe having an embedded plate, as described above. The formation fluid may be expelled through a port (not shown) or it may be sent to one or more fluid collecting chambers 926 and 928. In the illustrated example, the electronics and processing system 906 and/or a downhole control system are configured to control the extendable probe assembly 916 and/or the drawing of a fluid sample from the formation F.

As stated above, the Larmor frequency for an in situ NMR tool can be determined and used to acquire NMR data. An NMR tool is provided and placed in situ, for example, in a wellbore. An initial estimate of the Larmor frequency for the in situ NMR tool is made and NMR data are acquired using the in situ NMR tool. A spectral analysis can be performed on the NMR data or, optionally, the NMR data are digitized and a transform such as a discrete Fourier transform (DFT) is performed on the digitized NMR data. The modal frequency of the spectral analysis or DFT is determined, and the Larmor frequency for the in situ NMR tool is determined using the modal frequency. The NMR tool is modified to transmit at the determined Larmor frequency and then used to acquire further NMR data.

Optionally the NMR data can be mixed with a reference frequency signal. Preferably, the high frequency component from the mixed data is filtered and the low frequency component of the mixed data is digitized, though, if desired, the low frequency component may be filtered and the high frequency component digitized. Alternatively, the spectrum of the selected component could be analyzed from the analog signal. Regardless of whether a discrete Fourier transform (DFT) is performed on the digitized component of the mixed data or another type of spectral analysis is done, the modal frequency of the spectral analysis is determined, and the Larmor frequency is determined for the in situ NMR tool using the modal frequency and the reference frequency.

In view of the above and the figures, it should be readily apparent that the present disclosure introduces one or more methods to determine the Larmor frequency for an in situ nuclear magnetic resonance (NMR) tool. Such method may comprise: providing the NMR tool and placing the NMR tool in situ; making an initial estimate of the Larmor frequency for the in situ NMR tool; acquiring NMR data using the in situ NMR tool; performing a spectral analysis on the NMR data; determining the modal frequency from the spectral analysis; and determining the Larmor frequency for the in situ NMR tool using the modal frequency. Such method may further comprise modifying the transmission frequency of an antenna on the NMR tool to the determined Larmor frequency, and acquiring further NMR data using the modified NMR tool. The NMR tool may be a wireline, sampling, or while-drilling tool. The in situ NMR tool may be disposed in a wellbore during the method. The initial estimate of the Larmor frequency may be based on a temperature or Hall probe measurement. The NMR data may be FID data or spin-echo data. The method may further comprise digitizing the NMR data and stacking the digitized NMR data prior to performing the spectral analysis. The method may further comprise digitizing the NMR data and zero padding the digitized NMR data prior to performing the spectral analysis. The method may further comprise digitizing the NMR data and rotating the digitized NMR data to a zero phase angle prior to performing the spectral analysis. Determining the modal frequency may comprise at least one of: determining the mode of the magnitude of the spectral analysis; determining the mode of a phase-rotated real component of the spectral analysis; and/or determining the zero crossing of a phase-rotated imaginary component of the spectral analysis. Determining the Larmor frequency may comprise equating the Larmor frequency to the modal frequency. The spectral analysis may be one of a discrete Fourier transform, a fast Fourier transform, or a wavelet transform.

The present disclosure also introduces a method to determine the Larmor frequency for an in situ nuclear magnetic resonance (NMR) tool, comprising: providing the NMR tool and placing the NMR tool in situ; making an initial estimate of the Larmor frequency for the in situ NMR tool; acquiring NMR data using the in situ NMR tool; mixing the NMR data with a reference frequency signal; filtering a first frequency component from the mixed data; performing a spectral analysis on a second frequency component of the mixed data; determining the modal frequency of the spectral analysis; and determining the Larmor frequency for the in situ NMR tool using the modal frequency and the reference frequency. Such method may further comprise: modifying the transmission frequency of an antenna on the NMR tool to the determined Larmor frequency; and acquiring further NMR data using the modified NMR tool. The method may further comprise digitizing the NMR data and zero padding the digitized data prior to performing the spectral analysis. The method may further comprise digitizing the NMR data and rotating the digitized data to a zero phase angle prior to performing the spectral analysis. Determining the modal frequency may comprise at least one of: determining the mode of the magnitude of the spectral analysis; determining the mode of a phase-rotated real component of the spectral analysis; and/or determining the zero crossing of a phase-rotated imaginary component of the spectral analysis. Determining the Larmor frequency may comprise equating the Larmor frequency to the sum of the modal frequency and the reference frequency. The in situ NMR tool may be disposed in a wellbore during the method. The NMR data may be FID data or spin-echo data. The spectral analysis may be one of a discrete Fourier transform, a fast Fourier transform, or a wavelet transform.

The present disclosure also introduces a nuclear magnetic resonance (NMR) system that operates using a Larmor frequency determined while the NMR system is disposed in situ, comprising: a source for a static magnetic field; an antenna for transmitting and receiving an electromagnetic signal; electronics to modify the resonance frequency of the antenna; a sensor to measure an in situ temperature or an in situ magnitude of the static magnetic field; and a processor capable of: (1) providing an initial estimate of the Larmor frequency using information from the sensor, (2) performing a spectral analysis on NMR data acquired by the antenna, and (3) controlling the electronics.

The present disclosure also introduces a method to determine the Larmor frequency for an in situ nuclear magnetic resonance (NMR) tool, comprising: providing the NMR tool and placing the NMR tool in situ; making an initial estimate of the Larmor frequency for the in situ NMR tool; acquiring NMR data using the in situ NMR tool; digitizing the NMR data; performing a discrete Fourier transform (DFT) on the digitized NMR data; determining the modal frequency of the DFT; and determining the Larmor frequency for the in situ NMR tool using the modal frequency.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

What is claimed is:

1. A method, comprising:
   positioning a nuclear magnetic resonance (NMR) tool in a wellbore extending into a subterranean formation;
   making an initial estimate of a Larmor frequency for the NMR tool;
   acquiring NMR data using the NMR tool;
   digitizing the NMR data;
   zero padding the digitized NMR data;
   digitally extracting echo data from the acquired NMR data from the NMR tool;
   performing a spectral analysis on the NMR data;
   determining the modal frequency from the spectral analysis; and
   determining the Larmor frequency for the NMR tool using the modal frequency.

2. The method of claim 1 further comprising:
   modifying a transmission frequency of an antenna on the NMR tool to the determined Larmor frequency; and
   acquiring further NMR data using the modified NMR tool.

3. The method of claim 1 wherein the NMR tool is a wireline, sampling, or while-drilling tool.

4. The method of claim 1 wherein the initial estimate of the Larmor frequency is based on a temperature or Hall probe measurement.

5. The method of claim 1 wherein the NMR data are FID data or spin-echo data.

6. The method of claim 1 further comprising digitizing the NMR data and stacking the digitized NMR data prior to performing the spectral analysis.

7. The method of claim 1 further comprising digitizing the NMR data and rotating the digitized NMR data to a zero phase angle prior to performing the spectral analysis.

8. The method of claim 1 wherein determining the modal frequency comprises at least one of:
   determining a mode of the magnitude of the spectral analysis;
   determining a mode of a phase-rotated real component of the spectral analysis; or
   determining a zero crossing of a phase-rotated imaginary component of the spectral analysis.

9. The method of claim 1 wherein determining the Larmor frequency comprises equating the Larmor frequency to the modal frequency.

10. The method of claim 1 wherein the spectral analysis is one of a discrete Fourier transform, a fast Fourier transform, or a wavelet transform.

11. A method, comprising:
    positioning a nuclear magnetic resonance (NMR) tool in a wellbore extending into a subterranean formation;
    making an initial estimate of a Larmor frequency for the NMR tool;
    acquiring NMR data using the in situ NMR tool;
    mixing the NMR data with a reference frequency signal;
    filtering a first frequency component from the mixed data;
    digitally extracting echo data from the acquired NMR data from the in situ NMR tool;
    performing a spectral analysis on a second frequency component of the mixed data;
    determining a modal frequency of the spectral analysis; and
    determining the Larmor frequency for the NMR tool using the modal frequency and the reference frequency.

12. The method of claim 11 further comprising:
    modifying the transmission frequency of an antenna on the NMR tool to the determined Larmor frequency; and
    acquiring further NMR data using the modified NMR tool.

13. The method of claim 11 further comprising digitizing the NMR data and zero padding the digitized data prior to performing the spectral analysis.

14. The method of claim 11 further comprising digitizing the NMR data and rotating the digitized data to a zero phase angle prior to performing the spectral analysis.

15. The method of claim 11 wherein determining the modal frequency comprises at least one of:
    determining the mode of the magnitude of the spectral analysis;
    determining the mode of a phase-rotated real component of the spectral analysis; or
    determining the zero crossing of a phase-rotated imaginary component of the spectral analysis.

16. The method of claim 11 wherein determining the Larmor frequency comprises equating the Larmor frequency to a sum of the modal frequency and the reference frequency.

17. The method of claim 11 wherein the NMR data are FID data or spin-echo data.

18. The method of claim 11 wherein the spectral analysis is one of a discrete Fourier transform, a fast Fourier transform, or a wavelet transform.

19. A method, comprising:
    placing a nuclear magnetic resonance (NMR) tool in a wellbore extending into a subterranean formation;
    making an initial estimate of a Larmor frequency for the NMR tool;
    acquiring NMR data using the NMR tool;
    digitizing the NMR data;
    digitally extracting echo data from the digitized NMR data;
    performing a discrete Fourier transform (DFT) on the digitized NMR data;
    determining the modal frequency of the DFT; and
    determining the Larmor frequency for the in situ NMR tool using a modal frequency.

20. A method, comprising:
    positioning a nuclear magnetic resonance (NMR) tool for analysis;
    making an initial estimate of a Larmor frequency for the NMR tool;
    acquiring NMR data using the NMR tool;
    digitizing the NMR data;
    zero padding the digitized NMR data;
    performing a spectral analysis on the NMR data;
    determining a modal frequency from the spectral analysis; and
    determining the Larmor frequency for the NMR tool using the modal frequency.

21. The method of claim 20 further comprising:
    modifying a transmission frequency of an antenna on the NMR tool to the determined Larmor frequency; and
    acquiring further NMR data using the NMR tool.

22. The method of claim 20, wherein the NMR tool is one of a wireline, sampling, and while-drilling tool.

23. The method of claim 20, wherein the initial estimate of the Larmor frequency is based on one of a temperature and Hall probe measurement.

24. The method of claim 20, wherein the NMR data are one of FID data and spin-echo data.

25. The method of claim 20, further comprising:
digitizing the NMR data and stacking the digitized NMR data prior to performing the spectral analysis.

26. The method of claim 20, further comprising:
digitizing the NMR data and rotating the digitized NMR data to a zero phase angle prior to performing the spectral analysis.

27. The method of claim 20 wherein determining the modal frequency comprises at least one of:
determining a mode of the magnitude of the spectral analysis;
determining a mode of a phase-rotated real component of the spectral analysis; or
determining a zero crossing of a phase-rotated imaginary component of the spectral analysis.

28. The method of claim 20 wherein determining the Larmor frequency comprises equating the Larmor frequency to the modal frequency.

29. The method of claim 20 wherein the spectral analysis is one of a discrete Fourier transform, a fast Fourier transform, and a wavelet transform.

30. A method, comprising:
positioning a nuclear magnetic resonance (NMR) tool for testing;
making an initial estimate of a Larmor frequency for the NMR tool;
acquiring NMR data using the NMR tool;
mixing the NMR data with a reference frequency signal to create mixed data;
filtering a first frequency component from the mixed data;
performing a spectral analysis on a second frequency component of the mixed data;
determining a modal frequency of the spectral analysis; and
determining the Larmor frequency for the NMR tool using the modal frequency and the reference frequency signal.

* * * * *